(12) United States Patent
Lin et al.

(10) Patent No.: US 9,574,265 B2
(45) Date of Patent: Feb. 21, 2017

(54) ROTATION PLUS VIBRATION MAGNET FOR MAGNETRON SPUTTERING APPARATUS

(71) Applicant: Taiwan Semiconductor Manufacturing Co., Ltd., Hsin-Chu (TW)

(72) Inventors: Bo-Hung Lin, Kaohsiung (TW); Ming-Chih Tsai, Hsinchu (TW); You-Hua Chou, Hsinchu (TW); Chung-En Kao, Toufen Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 31 days.

(21) Appl. No.: 14/791,795

(22) Filed: Jul. 6, 2015

(65) Prior Publication Data

US 2015/0307985 A1     Oct. 29, 2015

Related U.S. Application Data

(62) Division of application No. 13/397,957, filed on Feb. 16, 2012, now Pat. No. 9,093,252.

(51) Int. Cl.
*C23C 14/35* (2006.01)
*H01J 37/32* (2006.01)
*H01J 37/34* (2006.01)

(52) U.S. Cl.
CPC ............. *C23C 14/351* (2013.01); *C23C 14/35* (2013.01); *H01J 37/32669* (2013.01);
(Continued)

(58) Field of Classification Search
CPC . H01J 37/3452; H01J 37/3455; H01J 37/3461
See application file for complete search history.

(56) References Cited

U.S. PATENT DOCUMENTS 5,593,551 A  1/1997  Lai
6,132,565 A  10/2000  Lin
(Continued)

FOREIGN PATENT DOCUMENTS

KR     1020000065829 A     11/2000

OTHER PUBLICATIONS

Non-Final Office Action dated Sep. 26, 2013 for U.S. Appl. No. 13/397,957.
(Continued)

*Primary Examiner* — Jason M Berman
(74) *Attorney, Agent, or Firm* — Eschweiler & Associates, LLC

(57) ABSTRACT

In some embodiments, the present disclosure relates to a plasma processing system having a magnetron that provides a symmetric magnetic track through a combination of vibrational and rotational motion. The disclosed magnetron has a magnetic element that generates a magnetic field. The magnetic element is attached to an elastic element connected between the magnetic element and a rotational shaft that rotates the magnetic element about a center of the sputtering target. The elastic element may vary its length during rotation of the magnetic element to change the radial distance between the rotational shaft and the magnetic element. The resulting magnetic track enables concurrent motion of the magnetic element in both an angular direction and a radial direction. Such motion enables a symmetric magnetic track that provides good wafer uniformity and a short deposition time.

20 Claims, 7 Drawing Sheets

(52) U.S. Cl.
CPC ...... *H01J 37/3408* (2013.01); *H01J 37/3452* (2013.01); *H01J 37/3455* (2013.01); *H01J 37/3461* (2013.01)

(56) References Cited

U.S. PATENT DOCUMENTS

| | | |
|---|---|---|
| 6,692,617 B1 | 2/2004 | Fu et al. |
| 6,960,284 B2 | 11/2005 | Fu et al. |
| 7,736,473 B2 | 6/2010 | Miller et al. |
| 2005/0211548 A1 | 9/2005 | Gung et al. |
| 2005/0263390 A1 | 12/2005 | Gung et al. |

OTHER PUBLICATIONS

Final Office Action dated Mar. 28, 2014 for U.S. Appl. No. 13/397,957.
Non-Final Office Action dated Jun. 19, 2014 for U.S. Appl. No. 13/397,957.
Final Office Action dated Sep. 24, 2014 for U.S. Appl. No. 13/397,957.
Notice of Allowance dated Mar. 27, 2015 for U.S. Appl. No. 13/397,957.

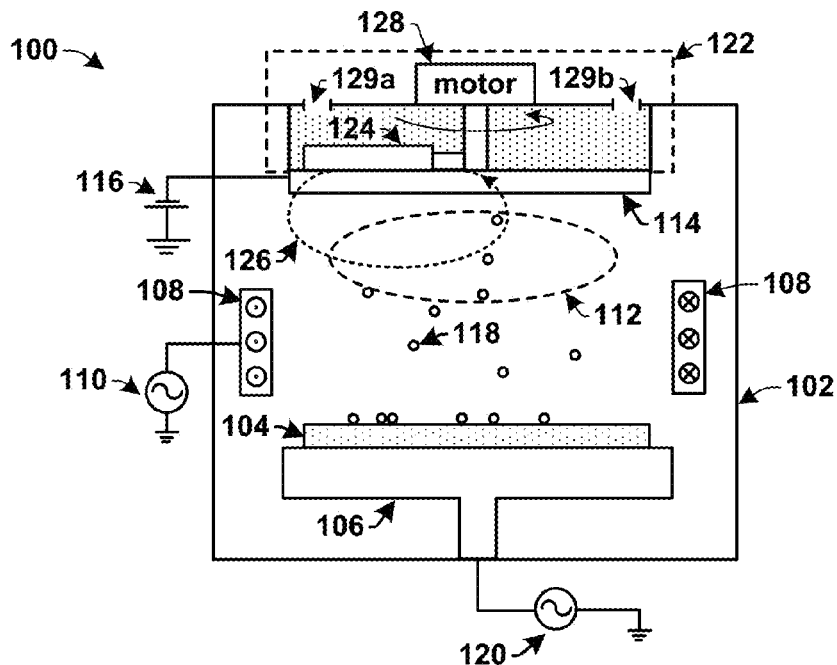
Fig. 1A
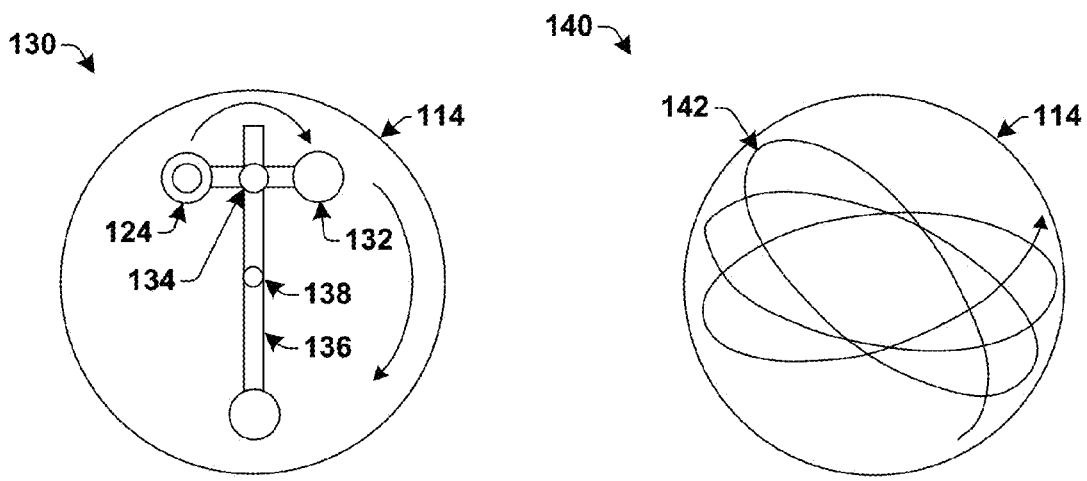
Fig. 1B
Fig. 1C (time = $t_1$)

(time = $t_2$)

ROTATION PLUS VIBRATION MAGNET FOR MAGNETRON SPUTTERING APPARATUS

REFERENCE TO RELATED APPLICATION

This application is a Divisional of U.S. application Ser. No. 13/397,957 filed on Feb. 16, 2012, the contents of which are incorporated by reference in their entirety.

BACKGROUND

Integrated chips are formed by complex fabrication processes, during which a workpiece is subjected to different steps to form one or more semiconductor devices. Some of the processing steps may comprise forming a thin film onto a semiconductor substrate. Thin films can be deposited onto a semiconductor substrate in a low-pressure processing chamber using physical vapor deposition.

Physical vapor deposition is typically performed by acting on a target with plasma comprising a plurality of high energy ions. The high energy ions collide with the target, dislodging particles into a vapor. The vapor is transported to a semiconductor substrate, upon which the vapor accumulates to form a thin film.

BRIEF DESCRIPTION OF THE DRAWINGS

FIG. 1A illustrates a cross-sectional view of a physical vapor deposition system comprising a magnetron.

FIG. 1B illustrates a top view of the magnetron shown in FIG. 1a.

FIG. 1C illustrates an exemplary magnetic track achieved by the magnetron shown in FIG. 1B.

DETAILED DESCRIPTION

Figure 2:
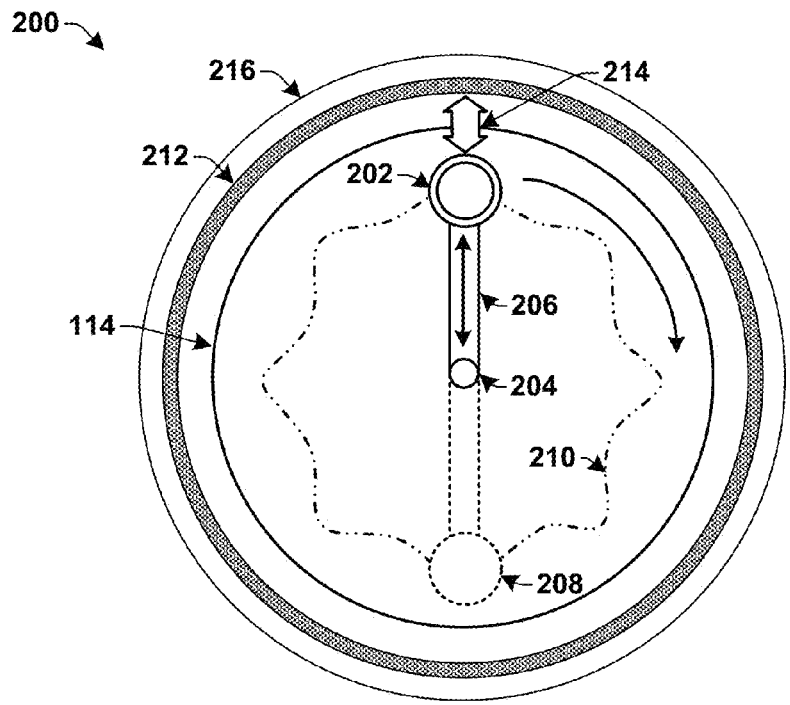
FIG. 2 illustrates a top view of some embodiments of a physical vapor deposition system comprising a magnetron configured to provide a symmetric magnetic track through a combination of vibrational and rotational motion.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1a illustrates a cross-sectional view of a physical vapor deposition system 100. The physical vapor deposition system 100 comprises a processing chamber 102 having a support pedestal 106 configured to hold a workpiece 104. A coil 108, connected to a power generator 110 operating at an RF frequency (e.g., 13.56 MHz), is configured to generate a magnetic field that transfers energy from the power generator 110 to gas particles within the processing chamber 102 to form a plasma 112. A target 114, located at the top of the processing chamber 102, is coupled to a high voltage D.C. power source 116 configured to apply a bias to the target 114. The bias causes high energy ions from the plasma 112 to sputter the target 114 and generate target atoms 118. The target atoms 118, after being ionized by coil 108 are attracted to the workpiece 104 (upon which they condense to form a thin film) by the magnetic field generated by the coil 108 and by a bias applied to the workpiece 104 by a power generator 120 coupled to the support pedestal 106.

A magnetron 122 is positioned on the back side of the target 114. The magnetron 122 comprises a magnetic element 124 that is rotated by a motor 128. The magnetic element 124 may be submerged in water (provided via inlet 129a and outlet 129b) for cooling purposes. During sputtering, the magnetic element 124 is configured to generate a magnetic field 126. The magnetic field 126 acts with a force on ions within the plasma 112 to trap the ions close to the target 114. The trapped ions collide with neutral gas particles near the target 114, enhancing ionization of the plasma 112 near the target 114 and leading to a higher sputter rate.

As illustrated in a top view 130 of the magnetron, shown in FIG. 1b, the magnetic element 124 and a first counter weight 132 are configured to rotate around a first pivot point 134, which is attached to a rigid structure 136 configured to rotate about a second pivot point 138. As illustrated in a top view 140, shown in FIG. 1c, such a magnetron design provides for a magnetic track 142 that progresses around the target 114 over more rotational cycles (i.e., a large number of rotational cycles). The more rotational cycles, combined with a relatively slow movement of the magnetic element when submerged in water for cooling, means that a relatively large time is needed for the magnetic element 124 to achieve complete coverage of the target 114 and to get a good wafer uniformity due to the more rotation cycles.

Accordingly, the present disclosure relates to a plasma processing system comprising a magnetron configured to provide an adjustable, symmetric magnetic track through a combination of vibrational and rotational motion. In some embodiments, the disclosed magnetron comprises a magnetic element configured to generate a magnetic field. The magnetic element is attached to an elastic element connected between the magnetic element and a rotational shaft configured to rotate the magnetic element about a center of the sputtering target. The elastic element is configured to vary its length during rotation of the magnetic element to change the radial distance between the rotational shaft and the magnetic element to enable concurrent motion of the magnetic element in both an angular direction and a radial direction.

Such motion allows for an adjustable, symmetric magnetic track that provides good wafer uniformity in a short deposition time.

FIG. 2 illustrates a top view of some embodiments of a physical vapor deposition system 200 comprising a magnetron configured to provide an adjustable, symmetric magnetic track achieved through a combination of vibrational and rotational motion.

The magnetron comprises a magnetic element 202 configured to generate a magnetic field within a processing chamber 216 configured to house a workpiece (not shown). The magnetron further comprises a first ambulatory element configured to move the magnetic element 202 in an angular (i.e., rotational) direction and a second ambulatory element configured to linearly move the magnetic element 202 in a radial direction concurrent to the angular motion. The concurrent angular and radial motion of the magnetic element 202 enables the magnetic element 202 to move along a symmetric magnetic track 210. The symmetric magnetic track 210 provides for good target utilization (i.e., full face erosion of target) while ensuring good deposition uniformity in a short time.

In some embodiments, the first ambulatory element comprises a rotational shaft 204 and the second ambulatory element comprises an elastic element 206 having a variable length. The magnetic element 202 is connected to the elastic element 206. The elastic element 206 extends from the magnetic element 202 to the rotational shaft 204, which is located at approximately the center of a sputtering target 114. The elastic element 206 is configured to vary its length, varying the distance of the magnetic element 202 with respect to the center of the target 114. The rotational shaft 204 is configured to concurrently rotate the magnetic element 202 about the center of the sputtering target 114 allowing the magnetic element 202 to follow the symmetric magnetic track 210. In some embodiments, the rotational shaft 204 is connected to a motor configured to turn the rotational shaft 204. By changing the speed of rotation and/or the speed and/or magnitude of changes in length, a symmetric magnetic track 210 having an adjustable path can be achieved.

In some embodiments, a secondary outside magnet 212 is located around the perimeter of the sputtering target 114. The secondary outside magnet 212 may comprise a plurality of permanent magnets or electromagnets positioned around the perimeter of the sputtering target 114. The secondary outside magnet 212 is configured to generate a secondary magnetic field that operates upon the magnetic element 202 with a repulsive force. The repulsive force 214 pushes the magnetic element 202 radially inward causing a change in the radial position of the magnetic element 202 (i.e., causing the length of the elastic element 206 to change). The repulsive force 214 opposes a centrifugal force, generated by rotation of the magnetic element, which pushes the magnetic element 202 outward. Together, the centrifugal force and the repulsive force generate a radially vibrational motion (i.e., a vibration motion in a radial direction) illustrated by the magnetic track 210.

In some embodiments, a counter weight 208 is located at a position along the elastic element 206 that opposes the position of the magnetic element 202. For example, as shown in FIG. 2, counter weight 208 and magnetic element 202 are on opposite sides of the rotational shaft 204. The counter weight 208 is configured to stabilize the magnetic element 202 by balancing the load of the magnetic element 202. This compensates for the weight of the magnetic element 202 and maintains balance in a rotational plane of the magnetron.

Figure 3:
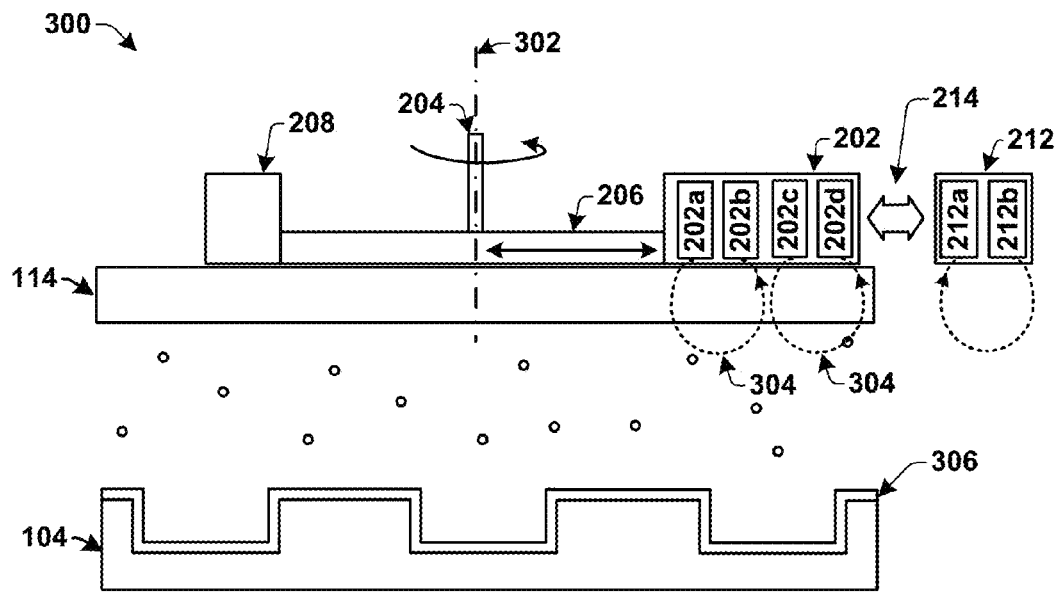
FIG. 3 illustrates a cross-sectional view of some embodiments of a physical vapor deposition system comprising a magnetron configured to provide a symmetric magnetic track through a combination of vibrational and rotational motion.

FIG. 3 illustrates a side view of some embodiments of a physical vapor deposition system 300 comprising a magnetron configured to provide an adjustable, symmetric magnetic track through a combination of vibrational and rotational motion.

As shown in FIG. 3, the rotational shaft 204 is located along an axis of rotation 302 that extends through the center of the sputtering target 114. The magnetron is located on a backside of sputtering target 114 (i.e., an opposite side of the target 114 as a workpiece 104), such that magnetic element 202 is configured to generate one or more magnetic fields 304 that extend through the sputtering target 114 to a region below the sputtering target 114. The magnetic fields 304 operate upon ions within a processing chamber to enhance the ionization of plasma near the sputtering target 114, leading to a higher sputter rate.

The magnetic element 202 may comprise any type or number of magnets. In some embodiments, the magnetic element 202 comprises one or more permanent magnets (e.g., neodymium magnets). Furthermore, the magnetic element 202 may comprise any size of magnets. As shown in FIG. 3, in some embodiments, the magnetic element 202 comprises a plurality of small magnets 202a-202d.

By placing small magnets having opposite polarities next to one another, one or more magnetic fields 304 having a high density can be achieved below the sputtering target 114. The high density of the magnetic fields 304 provides for good step coverage and good deposition symmetry over the surface of a workpiece 104. For example, thin film 306 is deposited to have symmetry between the deposited films on opposing sidewalls of a trench and to have a film thickness on the trench sidewalls that is approximately equal to the film thickness at the bottom of the trench.

The secondary outside magnet 212 is configured to have a magnetic polarity that generates a repulsive force 214 on the magnetic element 202. For example, magnetic elements 202d and 212a are configured to have a same magnetic configuration (e.g., a south magnetic pole located above a north magnetic pole). The configurations cause the like poles to act upon each other with a repulsive force 214 that opposes an outward centrifugal force to push the magnetic element 202 inward.

Figure 4:
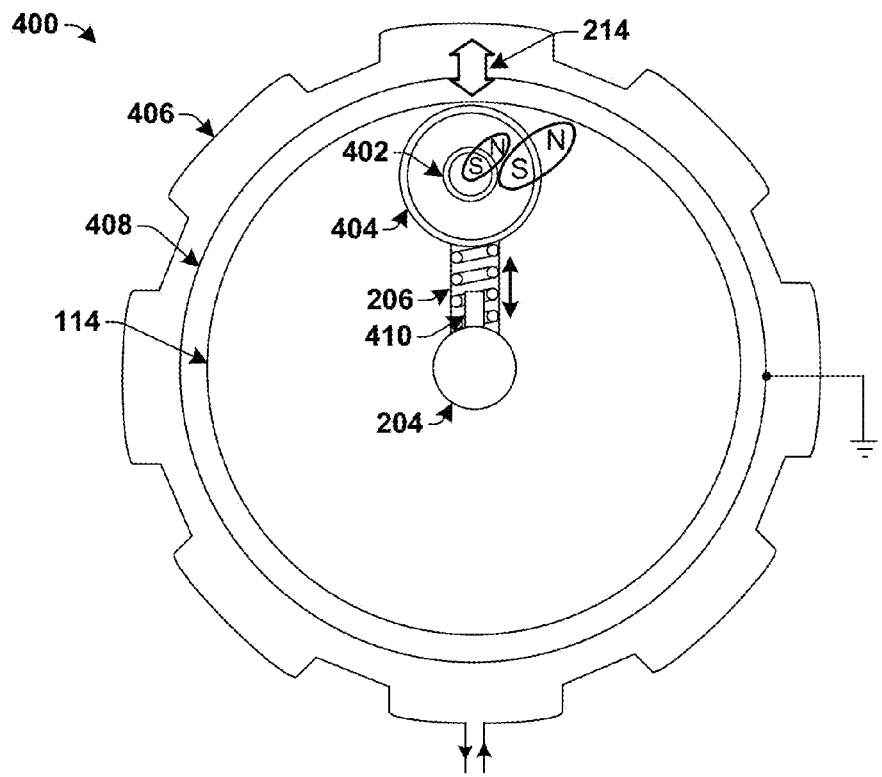
FIG. 4 illustrates a top view of some more detailed embodiments of a physical vapor deposition system comprising a magnetron configured to provide a symmetric magnetic track achieved through vibration plus rotation.

FIG. 4 illustrates a top view of some alternative embodiments of a magnetron 400 disclosed herein.

The magnetron 400 comprises a magnetic element 202 comprising concentric ring shaped magnets. In some embodiments, the concentric ring shaped magnets comprise an inner ring-shaped magnet 402 and an outer ring-shaped magnet 404, wherein the diameter of the inner ring-shaped magnet 402 is smaller than a diameter of the outer ring-shaped magnet 404. The inner and outer ring-shaped magnets 402 and 404 have a same magnetic polarity (e.g., a north magnetic pole facing outward and a south magnetic pole facing inward). In some embodiments, the inner and outer ring shaped magnets 402 and 404 comprise a plurality of strip magnets configured parallel to the ring's axis, such that adjacent strip magnets have opposing magnetic pole orientations.

In some embodiments, the magnetron 400 comprises an electromagnetic secondary outside magnet 406. The electromagnetic secondary outside magnet 406 is configured to vary the strength of the secondary magnetic field it generates based upon a current value provided to the electromagnetic secondary outside magnet 406. By changing the strength of the secondary magnetic field generated by the electromagnetic secondary outside magnet 406, a magnitude of variation in the radial length in the elastic element (i.e., an elastic length) can be changed. For example, by decreasing the secondary magnetic field strength generated by the electromagnetic secondary outside magnet 406, the elastic length is decreased (i.e., the elastic element will vary its radial position by a decreased amount).

In some embodiments, the electromagnetic secondary outside magnet 406 is located outside of a grounded chamber shielding 408 configured to confine plasma and protect the sidewalls of a processing chamber from deposition. In some embodiments, the secondary magnetic field generated by the electromagnetic secondary outside magnet 406 can be chosen to have a strength that prevents the magnetic element from hitting the chamber shielding 408.

In some embodiments, the elastic element 206 comprises a power system 410 configured to control changes in length of the elastic element 206. For example, the power system 410 may comprise a motor configured to control the length of the elastic element 206 and/or the speed at which the length of the elastic element 206 changes. By changing the length of the elastic element 206 the position of the magnetic element 202 relative to the sputtering target 114 is changed. Furthermore, the magnitude of the elastic length is changed. This is because changing the distance between the electromagnetic secondary outside magnet 406 and the magnetic element 202 also changes the magnitude of the repulsive force. For example, by decreasing the length of the elastic element 206, the magnetic element 202 is moved further from the electromagnetic secondary outside magnet 406, reducing the strength of the repulsive force 214 and reducing changes in the elastic length of the elastic element 206.

Figure 5:
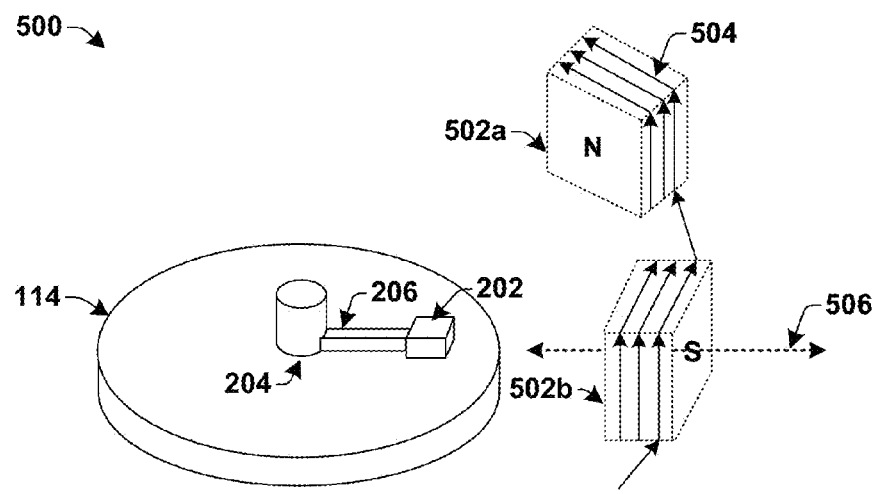
FIG. 5 illustrates a three dimensional view of some embodiments of a secondary outside magnet configured to induce vibrational motion in the magnetron.

FIG. 5 illustrates some embodiments of a physical vapor deposition system 500 having a secondary outside magnet 502 comprising a plurality of electromagnetic coils 502a, 502b. The electromagnetic coils 502a, 502b can be operated to adjust the repulsive force between the magnetic element 202 and the secondary outside magnet 502.

The electromagnetic coils 502a, 502b comprise a winding of electrically conducting wire 504. When current is passed through the electrically conducting wire 504, it generates a magnetic field proportional to the current (i.e., $B=\mu_0 ni$, where B is the magnetic field, $\mu_0$ is the is the permeability of free space ($4 \cdot \pi \cdot 10^{-7}$ V·s/(A·m)), n is the number of turns of the wire, and i is the current passed through the wire). Therefore, the strength of the magnetic field generated by the secondary outside magnet 500 can be dynamically varied by changing the current provided to the conductive wire 504.

In some embodiments, the electromagnetic coils 502a, 502b are oriented such that the axes 506 extending through the center of electromagnetic coils 502a and 502b intersect the rotational shaft 204 of the magnetron. Since the electromagnetic coils 502a, 502b are composed of conducting wire 504 that wraps around the axes 506, current flows through the electromagnetic coils 502a, 502b in a direction that generates magnetic fields along the axes 506 (i.e., which is perpendicular to the perimeter of sputtering target 114). By controlling the direction of current through the electromagnetic coils 502, the electromagnetic coils 502a, 502b can be operated to change the orientation of the generated magnetic field. For example, when current is provided to electromagnetic coils 502a, 502b in a first direction a magnetic field having a first magnetic orientation will result. Alternatively, when current is provided to electromagnetic coils 502a, 502b in a second direction opposite the first direction, a magnetic field having a second magnetic orientation opposite the first orientation will result.

As shown in FIG. 5, the direction of the current flow is chosen to generate a magnetic field that is radially inward causing electromagnetic coils 502a, 502b to have a north pole (N) located at the inward edge of the coil and a south pole (S) located at the outer edge of the coil. Alternatively, if the direction of the current flow is chosen to generate a magnetic field that is radially outward, the electromagnetic coils 502a, 502b will have a north pole (N) located at the outer edge of the coil and a south pole (S) located at the inner edge of the coil.

Figure 6A:
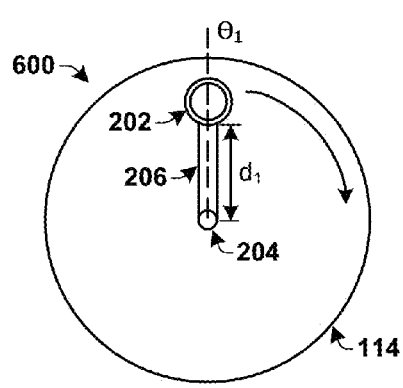
FIGS. 6A-6B show some exemplary top views of states of the disclosed magnetron over time.
Figure 6B:
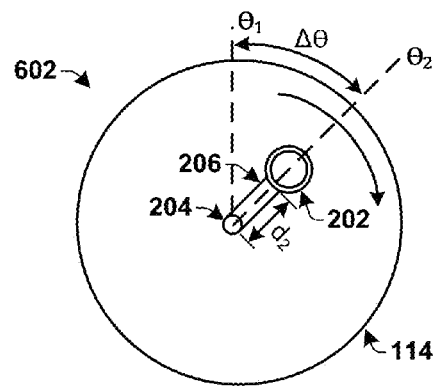

FIGS. 6a-6b show some exemplary top views of states of a disclosed magnetron during different times of operation.

FIG. 6a illustrates a first state 600 of a magnetron at a first time $t_1$. The magnetic element 202 of the magnetron is located at an angle of $_1$ and at a distance of $d_1$ from the center of the sputtering target 114.

FIG. 6b illustrates a second state 602 of the magnetron at a second time $t_2$, which is later than the first time $t_1$. From the first time $t_1$ to the second time $t_2$, the magnetic element 202 has progressed by an angle of $\Delta$, causing the magnetic element 202 of the magnetron to be located at an angle of $_2>_1$. The magnetic element 202 has also decreased its distance from the center of the sputtering target 114 to a distance $d_2<d_1$. Therefore, over time the magnetic element 202 has undergone both a change in angular position (e.g., from $_1$ to $_2$) and a change in radial position (e.g., from $d_1$ to $d_2$).

By varying the rotational frequency, the variable length of the elastic element, and/or the elastic length of the elastic element, the path of the magnetic track can be changed. For example, FIGS. 7a-7d illustrate magnetic tracks (i.e., paths that magnetic element 202 follows) obtained through various combinations of rotational frequency, changes in the length of the elastic element, and changes in the elastic length. It will be appreciated that the magnetic tracks are examples of the symmetric magnetic tracks that can be achieved by the disclosed magnetron and are not limiting to motion of the magnetron disclosed herein. Furthermore, it will be appreciated that the length of the elastic element is illustrated as a unitless quantity between 0-10 units. The value of the unitless quantity will vary depending on a size of the target used. For example, for a target having a diameter of 100 mm, a unitless quantity is half of that of a unitless quantity for a target having a diameter of 200 mm (e.g., a unit for a 100 mm target is 10 mm, a unit for a 200 mm target is 20 mm).

Figure 7A:
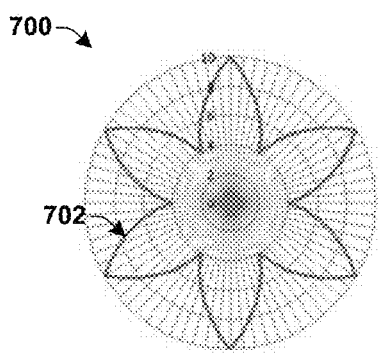
FIGS. 7A-7D illustrates some exemplary magnetic tracks that can be achieved by the disclosed magnetron.

FIG. 7a illustrates a top view 700 of an embodiment of an exemplary magnetic track 702. Magnetic track 702 has an elastic length of 6 units. This means that the magnetic element is able to change its radial position by six units, for example from a distance of 4 units to a distance of 10 units from the center of the target (i.e., from 0 units). The magnetic track 702 also has an elastic period equal to $\frac{1}{6}^{th}$ of a rotational period. This means that during one rotation the magnetic track 702 will expand and then return to a specific radial value six times.

Figure 7B:
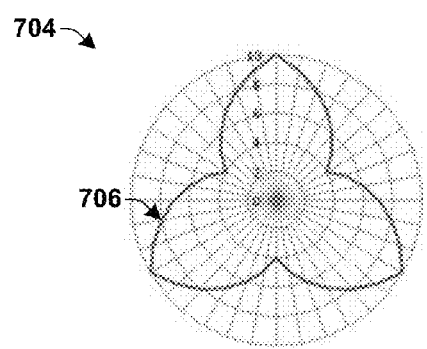

FIG. 7b illustrates a top view 704 of an embodiment of a first modified magnetic track 706. The first modified magnetic track 706 illustrates changes to magnetic track 702 that can be achieved by increasing the rotational frequency of the magnetic element. In some embodiments, the rotational frequency can be increased by increasing the rotational speed of the magnetic element. By increasing the rotational speed of the magnetic element, the magnetic element expands and returns to its original radial value less times during a rotation. For example, the first modified magnetic track 706 has an elastic period equal to $\frac{1}{3}^{rd}$ of a rotational period, such that during one rotation the magnetic track will expand and then return to its original radial value three times.

Figure 7C:
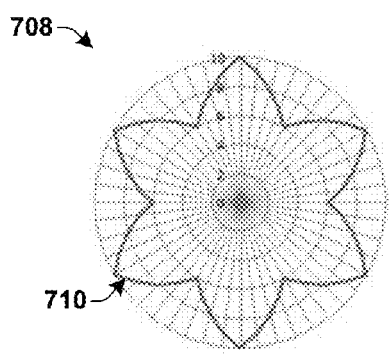

FIG. 7c illustrates a top view 708 of an embodiment of second modified magnetic track 710. The second modified magnetic track 710 illustrates changes to magnetic track 702 achieved by decreasing the elastic length of the elastic element. In some embodiments, the elastic length can be decreased by changing the secondary magnetic field strength (and therefore the repulsive force) generated by the secondary outside magnet. By decreasing the secondary magnetic field strength generated by the secondary outside magnet, the magnetic element changes its radial position by a smaller amount. For example, the second modified magnetic track 710, having an elastic length of 4 units, is configured to change its radial position from a distance of 6 units to a distance of 10 units from the center of the target (e.g., to elastically vary from 8 to 10 and from 8 to 6).

Figure 7D:
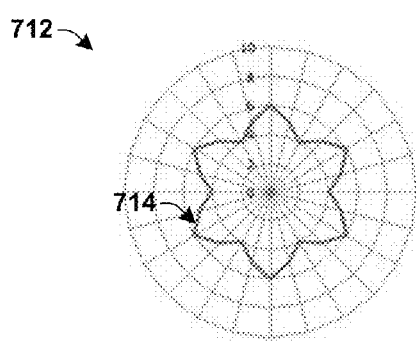

FIG. 7d illustrates a top view 712 of an embodiment of a third modified magnetic track 714. The third modified magnetic track 714 illustrates changes to magnetic track 702 achieved by decreasing the variable length of the elastic element. By decreasing the variable length of the elastic element, the magnetic element changes its position around a position that is closer to the target center. For example, the third modified magnetic track 714 is configured to change its radial position around a distance of 5 units from the center of the target. Furthermore, decreasing the length of the elastic element moves the magnetic element further from the secondary magnetic element, reducing the strength of the repulsive force and the elastic length of the elastic element. For example, the third modified magnetic track 714 has an elastic length of 2 units.

It will be appreciated that the elastic element disclosed herein may comprise a variety of extendable structures. FIGS. 8a-10 illustrate three possible embodiments of an elastic element configured to vary the radial position of a disclosed magnetron's magnetic element.

Figure 8A:
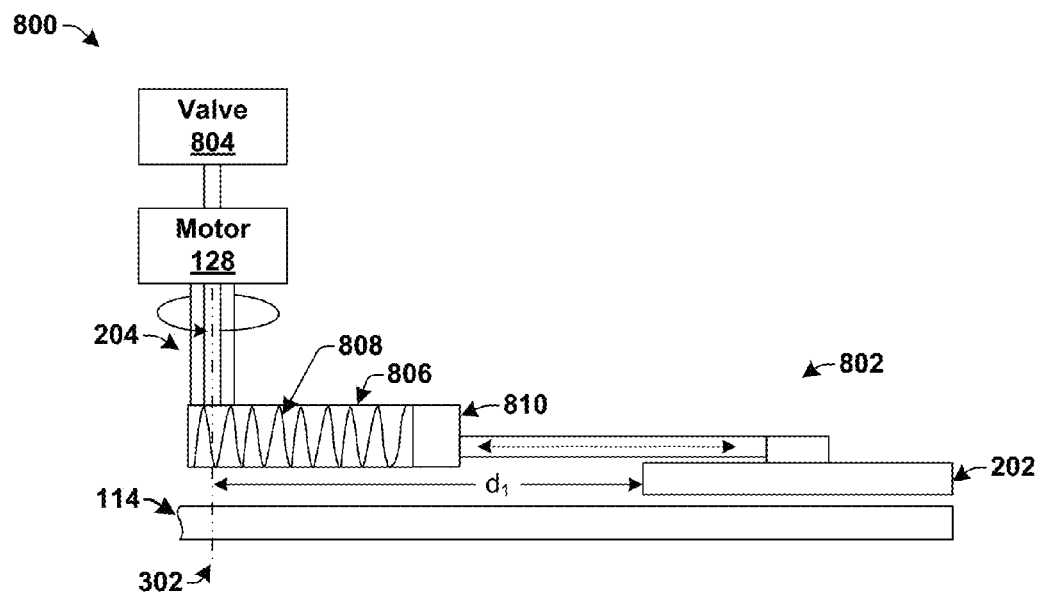
FIGS. 8A-8B illustrate side views of some embodiments of an elastic element comprising a pneumatic valve.
Figure 8B:
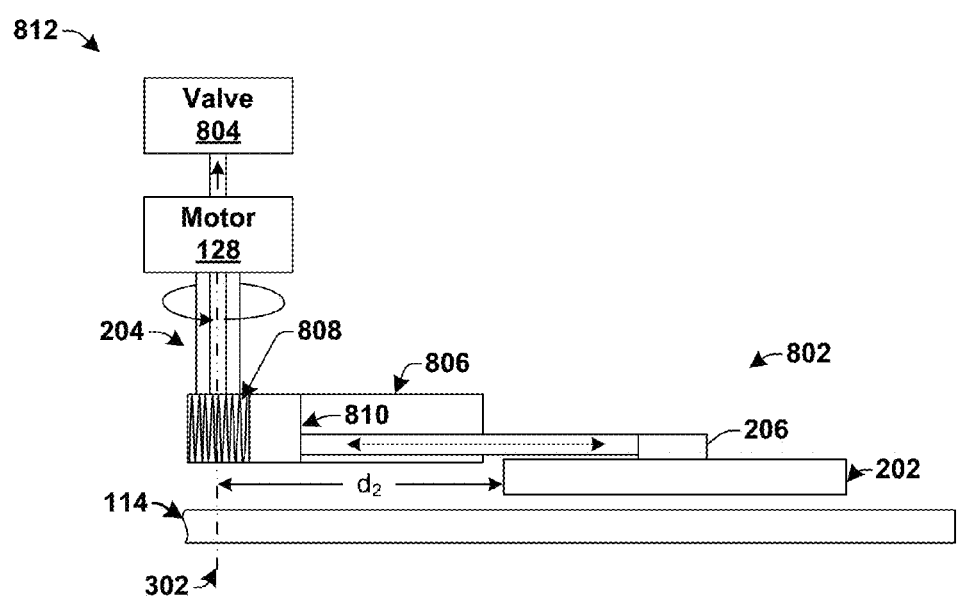

FIGS. 8a-8b illustrate block diagrams of some embodiments of a magnetron 800 comprising an elastic element 802 having a pneumatic valve 804.

The magnetron 800 comprises a motor 128 configured to rotate a rotational shaft 204 around an axis of rotation 302 that extends through the center of a sputtering target 114. The rotational shaft 204 is connected to a cantilevered structure of the magnetron comprising a cylinder 806, an elastic element 802, and the magnetic element 202. It will be appreciated that the elastic element 802 may comprise the cylinder 806 along with one or more elastic components connected between the rotational shaft 204 and the magnetic element 202. The one or more elastic components provide for an elasticity that allows for the magnetic element 202 to move in a radially vibrational motion.

The pneumatic valve 804 is configured to control the flow of air, allowing for air to enter and leave the cylinder 806, which has a moveable piston 810. The piston 810 is connected to a spring 808 on one side and the magnetic element 202 on the other side. As air enters the cylinder 806 through the pneumatic valve 804, the pressure of the air pushes on the piston 810 expanding the spring 808 from its equilibrium position.

As shown in FIG. 8a, when the pneumatic valve 804 is closed, air cannot escape from the cylinder 806 and the magnetic element 202 is at a first median distance $d_1$ from axis of rotation 302 (i.e., a distance $d_1$ around which the elastic element can vibrate). As shown in FIG. 8b, when the pneumatic valve 804 is open, compressed air is driven out of the cylinder 806 by the force exerted by the spring 808 as it returns to its equilibrium position. As the spring 808 contracts, the piston 810 moves, changing the position of the magnetic element 202 to a second median distance $d_2$ from axis of rotation 302. Therefore, by opening and closing the pneumatic valve 804, the elastic element 802 can change the position of a magnetic element 202 relative to the axis of rotation 302.

Figure 9A:
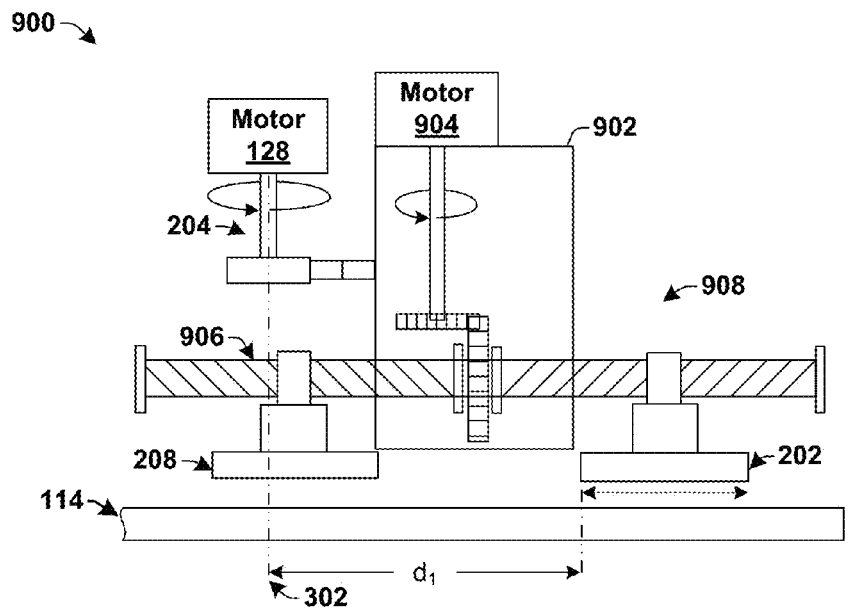
FIGS. 9A-9B illustrate side views of some embodiments of an elastic element comprising a gear based design.
Figure 9B:
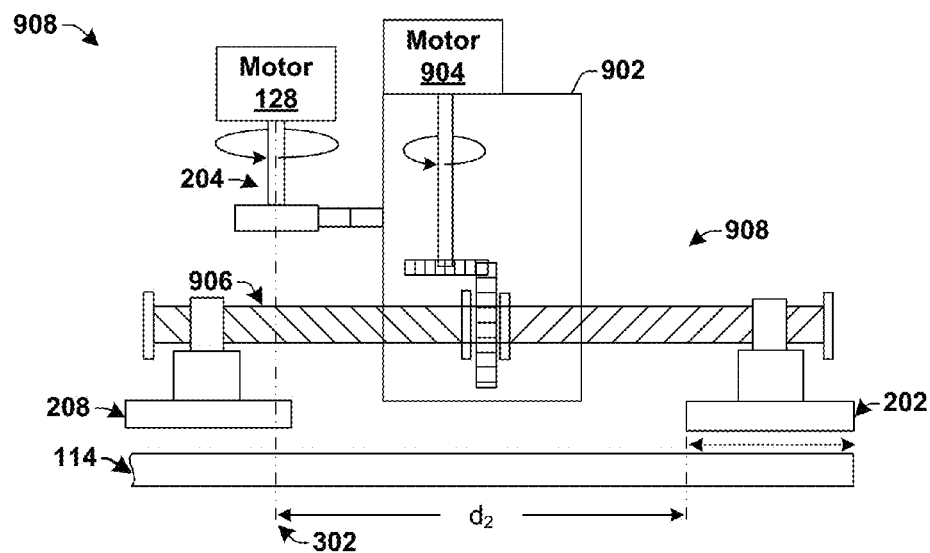

FIGS. 9a-9b illustrates block diagrams of some embodiments of a magnetron 900 comprising an elastic element 908 having a lead screw design.

The magnetron 900 comprises a first motor 128 configured to rotate a rotational shaft 204 around an axis of rotation 302 that extends through the center of a sputtering target 114. The rotational shaft 204 is connected to a gear box 902 containing a second motor 904. The gear box 902 is connected to a screw shaft 906. A first end of the screw shaft 906 is connected to magnetic element 202 (e.g., by way of one or more elastic components) and a second end of the screw shaft 906 is connected to a counter weight 208.

The gear box 902 is configured to turn a screw shaft 906, thereby translating a turning motion of the second motor 904 into a linear motion that changes the position of magnetic element 202 relative to the gear box 902. In some embodiments, the first and second ends of the screw shaft have opposite threading directions, so that as the screw shaft 906 turns, the opposite threading directions move the magnetic element 202 and the counter weight 208 in opposite directions.

For example, as shown in FIG. 9a, magnetic element 202 is located at a first median distance $d_1$ from axis of rotation 302. By turning the screw shaft 906, magnetic element 202 is moved to a second median distance $d_2$ from axis of rotation 302, as shown in FIG. 9b. Furthermore, due to the opposing thread directions, the counter weight 208 is moved in an opposite direction. In some embodiments, the magnetic element 202 and counter weight 208 are configured to move in opposite directions at the same velocity. However, it will be appreciated that the relative motions of the counter weight 208 and magnetic element 202 can be adjusted based upon threading characteristics.

Figure 10:
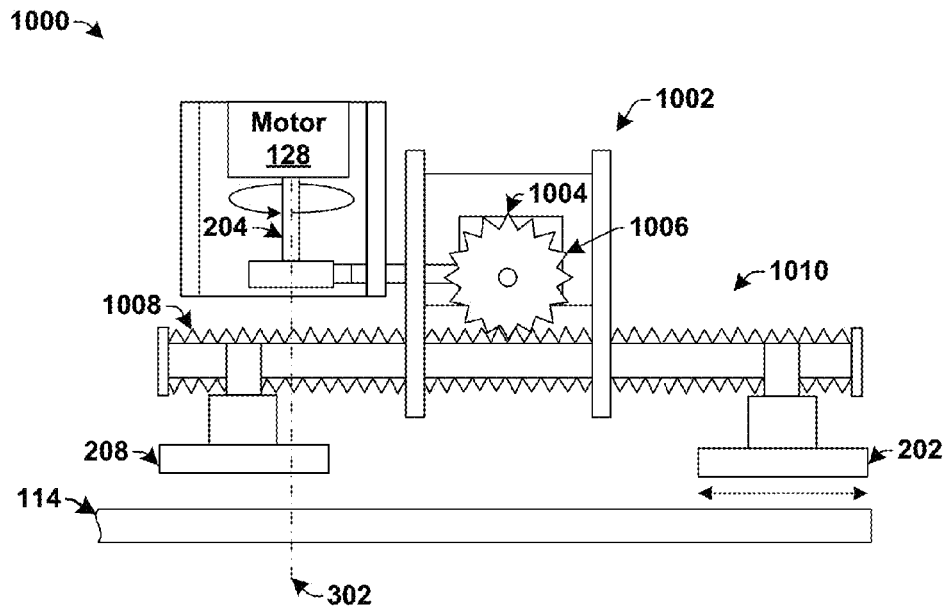
FIG. 10 illustrates a side view of some embodiments of an elastic element comprising a screw based design.

FIG. 10 illustrates a block diagram of some embodiments of a magnetron 1000 comprising an elastic element 1010 having a worm drive gear design.

The magnetron 1000 comprises a first motor 128 configured to rotate a rotational shaft 204 around an axis of rotation 302 that extends through the center of a sputtering target 114. The rotational shaft 204 is connected to a gear box 1002 containing a second motor 1004. The second motor 1004 is configured to drive a worm wheel 1006, having teeth with edges that are straight and aligned parallel to the axis of rotation, meshed with a worm gear 1008 (i.e., in the form of a screw).

A magnetic element 202 is connected to one end of the worm gear 1008 (e.g., by way of one or more elastic components) while a counter weight 208 is connected on an opposite end of the worm gear 1008. As the second motor 1004 turns the worm wheel 1006, the worm gear 1008 moves the magnetic element 202 and the counter weight 208 in a same direction, changing the location of the magnetic element 202 with respect to axis of rotation 302.

Figure 11:
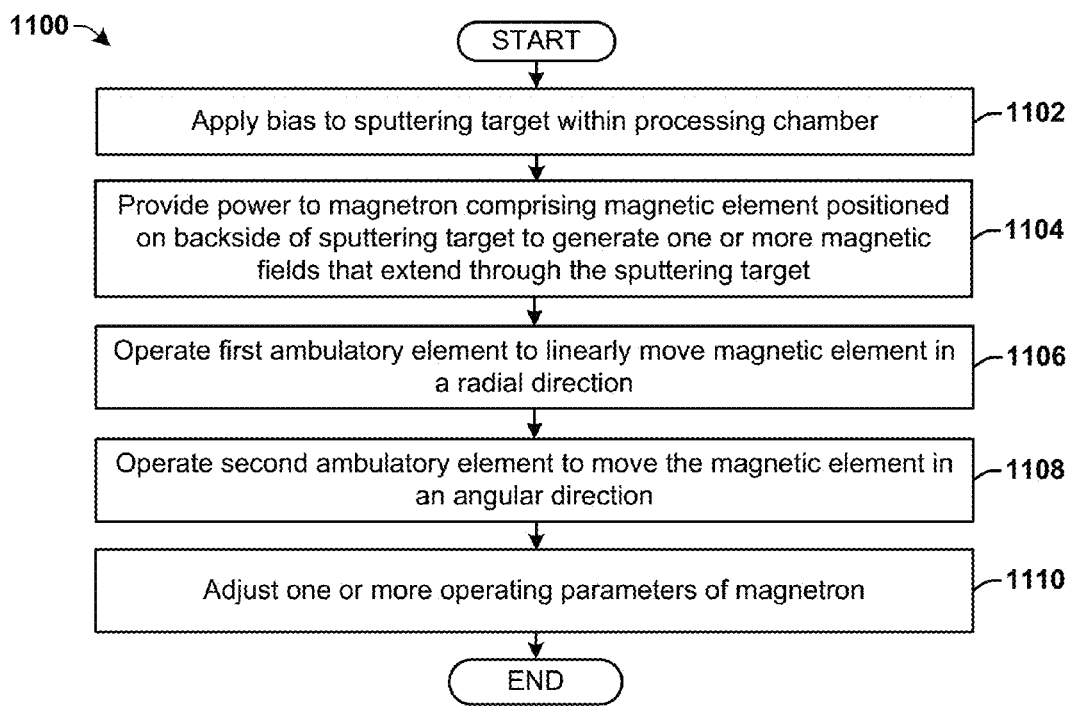
FIG. 11 illustrates a flow diagram of some embodiments of a method for operating a magnetron configured to provide a symmetric magnetic track achieved through vibration plus rotation.

FIG. 11 illustrates a flow diagram of some embodiments of a method 1100 for operating a magnetron configured to provide an adjustable, symmetric magnetic track achieved through a combination of vibrational and rotational motion.

While method 1100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 1102, a bias is applied to a sputtering target within a processing chamber. The bias causes high energy ions from a plasma within the processing chamber to sputter the sputtering target and generate target atoms.

At step 1104, a power source is operated to provide power to a magnetron comprising a magnetic element positioned on backside of sputtering target to generate one or more magnetic fields that extend through the sputtering target.

At step 1106, a first ambulatory element is operated to concurrently move the magnetic element in an angular direction. The angular direction extends tangentially to the radial direction. In some embodiments, the first ambulatory element comprises a rotational shaft connected to the elastic element and configured to rotate the elastic element around a rotational axis.

At step 1108, a second ambulatory element is operated to linearly move magnetic element in a radial direction. The radial direction extends radially outward from a center of the sputtering target. In some embodiments, the second ambulatory element comprises an elastic element configured to change its length. The elastic element may comprise a pneumatic valve spring, a lead screw, or a worm drive. In some embodiments, the second ambulatory element further comprises a secondary outside magnet operated to generate a repulsive force in a radially inward direction. The repulsive force is opposed by an outward centrifugal force to achieve a vibrational motion in the radial direction.

Together, the first and second ambulatory elements enable concurrent motion of the magnetic element in both an angular direction and a radial direction to enable symmetric magnetic vibration plus rotation track. The symmetric magnetic track ensures good wafer uniformity in a small deposition time.

At step 1110, one or more operating parameters of the magnetron are adjusted to vary the magnetic track, in some embodiments. In various embodiments, the one or more operating parameters may comprise the rotational frequency, the variable length of the elastic element, and/or the elastic length of the elastic element.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a plasma processing system comprising a magnetron configured to provide an adjustable, symmetric magnetic track through a combination of vibrational and rotational motion, and an associated method.

In some embodiments, the present disclosure relates to a method of performing a physical vapor deposition process. The method comprises providing power to a magnetron comprising a magnetic element, arranged on a backside of a sputtering target, to generate a magnetic field that extends through the sputtering target. The method further comprises moving the magnetic element in an angular direction around an axis-of-rotation. The method further comprises generating a secondary magnetic field that pushes the magnetic element toward the axis-of-rotation with a repulsive force that concurrently moves the magnetic element in a radial direction.

In another embodiment, the present disclosure relates to a method of performing a physical vapor deposition process. The method comprises applying a biasing voltage to a sputtering target, and moving a magnetic element of a magnetron arranged on a backside of the sputtering target in an angular direction around an axis-of-rotation extending through a center of the sputtering target, wherein the magnetic element is configured to generate one or more magnetic fields that extend through the sputtering target. The method further comprises generating a secondary magnetic field that pushes the magnetic element toward the axis-of-rotation with a repulsive force that concurrently moves the magnetic element in a radial direction.

In another embodiment, the present disclosure relates to a method of performing a physical vapor deposition process. The method comprises moving a magnetic element of a magnetron, arranged on a backside of a sputtering target, in an angular direction around an axis-of-rotation, wherein the magnetic element is configured to generate one or more magnetic fields that extend through the sputtering target. The method further comprises generating a secondary magnetic field that pushes the magnetic element toward the axis-of-rotation with a repulsive force that concurrently moves the magnetic element in a radial direction. The secondary magnetic field has a value that causes the repulsive force to be equal to a centrifugal force of the magnetic element at a location within a magnetic track of the magnetic element.

What is claimed is:

1. A method of performing a physical vapor deposition process, comprising:
   providing power to a magnetron comprising a magnetic element, arranged on a backside of a sputtering target, to generate a magnetic field that extends through the sputtering target;
   moving the magnetic element in an angular direction around an axis-of-rotation; and
   generating a secondary magnetic field that pushes the magnetic element toward the axis-of-rotation with a repulsive force that concurrently moves the magnetic element in a radial direction.

2. The method of claim 1, wherein the axis-of-rotation extends through a center of the sputtering target.

3. The method of claim 1, wherein the secondary magnetic field is generated by a secondary outside magnet disposed around a perimeter of the magnetron.

4. The method of claim 3, wherein the secondary outside magnet is laterally positioned around a perimeter of the sputtering target at a location vertically offset from the sputtering target.

5. The method of claim 3, wherein the repulsive force has a value equal to a centrifugal force of the magnetic element at a position that is laterally between the axis-of-rotation and the secondary outside magnet, so as to offset the centrifugal force.

6. The method of claim 3, wherein the secondary outside magnet has a bottom surface that faces the backside of the sputtering target.

7. The method of claim 1, further comprising:
concurrently moving the magnetic element and a counter weight connected to the magnetic element in opposite directions.

8. The method of claim 1, further comprising:
dynamically varying a strength of the secondary magnetic field to change a range of motion of the magnetic element within the radial direction.

9. The method of claim 1, further comprising:
dynamically varying an orientation of the secondary magnetic field.

10. The method of claim 1, wherein the magnetic element comprises concentric ring shaped magnets having an inner ring-shaped magnet and an outer ring-shaped magnet having a same magnetic polarity.

11. A method of performing a physical vapor deposition process, comprising:
applying a biasing voltage to a sputtering target;
moving a magnetic element of a magnetron arranged on a backside of the sputtering target in an angular direction around an axis-of-rotation extending through a center of the sputtering target, wherein the magnetic element is configured to generate one or more magnetic fields that extend through the sputtering target; and
generating a secondary magnetic field that pushes the magnetic element toward the axis-of-rotation with a repulsive force that concurrently moves the magnetic element in a radial direction.

12. The method of claim 11, wherein the secondary magnetic field is generated by a secondary outside magnet disposed around a perimeter of the magnetron.

13. The method of claim 12, wherein the secondary outside magnet has a bottom surface that faces the sputtering target and that vertically overlies the sputtering target.

14. The method of claim 11, further comprising:
dynamically varying a range of motion of the magnetic element within the radial direction.

15. The method of claim 14, further comprising:
dynamically varying a strength of the secondary magnetic field to change the range of motion of the magnetic element within the radial direction.

16. The method of claim 11, further comprising:
dynamically varying an orientation of the secondary magnetic field.

17. A method of performing a physical vapor deposition process, comprising:
moving a magnetic element of a magnetron, arranged on a backside of a sputtering target, in an angular direction around an axis-of-rotation, wherein the magnetic element is configured to generate one or more magnetic fields that extend through the sputtering target;
generating a secondary magnetic field that pushes the magnetic element toward the axis-of-rotation with a repulsive force that concurrently moves the magnetic element in a radial direction; and
wherein the secondary magnetic field has a value that causes the repulsive force to be equal to a centrifugal force of the magnetic element at a location within a magnetic track of the magnetic element.

18. The method of claim 17, further comprising:
dynamically varying a strength of the secondary magnetic field to change a range of motion of the magnetic element within the radial direction.

19. The method of claim 17, wherein the secondary magnetic field is generated by a secondary outside magnet disposed around a perimeter of the magnetron.

20. The method of claim 19, wherein the secondary outside magnet has a bottom surface that faces the sputtering target and that vertically overlies the sputtering target.

* * * * *